United States Patent [19]

Ando et al.

[11] Patent Number: 5,668,194

[45] Date of Patent: Sep. 16, 1997

[54] ROOM TEMPERATURE CURING COMPOSITION

[75] Inventors: Naotami Ando; Toshiyuki Masuda; Takanori Hatano; Kazuya Nakayama, all of Hyogo, Japan

[73] Assignee: Kanegafuchi Chemical Industry Co., Ltd., Osaka, Japan

[21] Appl. No.: 572,581

[22] Filed: Dec. 14, 1995

Related U.S. Application Data

[63] Continuation of Ser. No. 226,534, Apr. 12, 1994, abandoned.

[30] Foreign Application Priority Data

Apr. 22, 1993 [JP] Japan ................................ 5-095890

[51] Int. Cl.$^6$ .................................................... C08L 43/04
[52] U.S. Cl. ........................ 523/201; 524/547; 524/806; 525/288; 525/902; 526/279; 526/287; 526/329.6
[58] Field of Search ........................... 523/201; 524/806, 524/547; 525/288, 902; 526/279, 287, 329.6

[56] References Cited

U.S. PATENT DOCUMENTS

| | | | |
|---|---|---|---|
| 3,706,697 | 12/1972 | Backderf | 526/279 |
| 3,997,485 | 12/1976 | Dowbenko et al. | 523/201 |
| 5,135,981 | 8/1992 | Matsumaru et al. | 524/806 |
| 5,171,764 | 12/1992 | Katayama et al. | 523/201 |
| 5,214,095 | 5/1993 | Lavoie | 524/806 |
| 5,288,771 | 2/1994 | Takaya et al. | 523/201 |

FOREIGN PATENT DOCUMENTS

| | | |
|---|---|---|
| 0346886 | 12/1989 | European Pat. Off. . |
| 3916185 | 2/1990 | Germany . |

*Primary Examiner*—Andrew E. C. Merriam
*Attorney, Agent, or Firm*—Jordan and Hamburg

[57] ABSTRACT

This invention relates to a room temperature curing composition for use in various coatings for interior and exterior sidings, automotive bodies, household electrical appliances and plastic substrates and particularly for coatings required to have weather resistance and durability. The room temperature curing composition of this invention comprises an emulsion obtained by a multi-stage polymerization of monomers, said emulsion comprising emulsion particles, the core of which is formed by polymerization of (A) a silyl group-containing vinyl monomer, (B) an alkyl or cycloalkyl methacrylate whose alkyl moiety contains not less than 4 carbon atoms, and (C) a non-hydrophilic vinyl monomer other than (B) and the outer shell of which is formed by polymerization of (A), (B), (C) and (D) a hydrophilic vinyl monomer. The room temperature curing composition of this invention features a high stability of silyl groups it contains and a remarkably improved film-forming property even after prolonged storage. Moreover, it is very satisfactory in mechanical stability, water resistance, durability and white enamel gloss.

8 Claims, No Drawings

ROOM TEMPERATURE CURING COMPOSITION

This application is a continuation of application Ser. No. 08/226,534 filed on Apr. 12, 1994, now abandoned.

BACKGROUND OF THE INVENTION

This invention relates to a room temperature curing composition for various coating systems, particularly for weather-resistant, durable coatings, for application to interior and exterior sidings, automotive shell plates, home electrical appliance housings, and various plastic substrates.

BACKGROUND OF THE INVENTION

Recently, in the field of coatings and adhesives, organic solvent-based systems are being replaced with water-soluble or -dispersible systems to clear the regulations for pollution control and for resources conservation.

However, because of the absence of crosslinking functional groups, the conventional water-based coating systems are susceptible to the influence of the surfactants used in the polymerization system so that the coating films that can be obtained are poor in weather resistance, water resistance and fouling resistance, thus being inferior to solvent-based coating systems in many film physical properties.

Therefore, to provide a crosslinkable emulsion, the application of an alkoxysilyl group-containing emulsion in the field of coatings has been proposed. However, the alkoxysilyl group is easily hydrolyzed in the presence of water so that the film-forming performance of the emulsion suffers considerable aging and, moreover, the emulsion is poor in mechanical stability and white enamel gloss.

SUMMARY OF THE INVENTION

The object of this invention is to provide a room temperature curing composition which is not only satisfactory in the retention of film-forming property even after prolonged storage but also superior to the conventional composition in mechanical stability, water resistance, durability and white enamel gloss.

After an intensive research done to accomplish the above object, the inventors of this invention found that when an emulsion polymerization reaction is carried out in multiple stages and hydrophilic groups are introduced into the outermost shell layer of emulsion particles, the stability of silyl groups is remarkably enhanced so that the silyl groups are prevented from reacting in the course of polymerization or during storage and that said mechanical stability and white enamel gloss are both remarkably improved. This invention has been developed on the basis of the above finding.

This invention is, therefore, directed to a room temperature curing composition comprising an emulsion obtained by a multi-stage emulsion polymerization of a plurality of constituent monomers, wherein the core monomer composition of emulsion particles comprises 1–30 weight % of (A) a silyl group-containing vinyl monomer of the undermentioned general formula (I), 60–99 weight % of (B) at least one monomer selected from the class consisting of alkyl methacrylates whose alkyl moieties contain not less than 4 carbon atoms each and cycloalkyl methacrylates whose cycloalkyl moieties contain not less than 4 carbon atoms each, and 0–39 weight % of (C) a non-hydrophilic vinyl monomer other than (B) and the outer shell monomer composition of said emulsion particles comprises 0.5–30 weight % of (D) at least one hydrophilic vinyl monomer selected from the class consisting of α,β-ethylenically unsaturated carboxylic acids, styrenesulfonic acid, vinylsulfonic acid, sodium styrenesulfonate, 2-sulfoethyl methacrylate sodium, 2-sulfoethyl methacrylate ammonium, acrylamide, methacrylamide, N-methylolacrylamide, N-methylolmethacrylamide, dialkylaminoalkyl methacrylates, dialkylaminoalkyl methacrylate hydrochlorides, 2-aminoethyl methacrylate hydrochloride, polyethoxylated vinyl monomers and polypropoxylated vinyl monomers, 0–30 weight % of (A) a silyl group-containing vinyl monomer of the under-mentioned general formula (I), 60–99.5 weight % of (B) at least one monomer selected from the class consisting of alkyl methacrylates whose alkyl moieties contain not less than 4 carbon atoms each and cycloalkyl methacrylates whose cycloalkyl moieties contain not less than 4 carbon atoms each and 0–39.5 weight % of (C) a non-hydrophilic vinyl monomer other than (B):

wherein R represents a monovalent hydrocarbon group selected from $C_{1-10}$ alkyl, aryl and aralkyl groups; X represents a halogen atom or a group selected from the class consisting of alkoxy, hydroxy, acyloxy, aminooxy, phenoxy, thioalkoxy and amino; y represents a whole number of 0–2; where X and R, bound to Si, respectively represent more than one groups, such groups may be the same or different groups.

DETAILED DESCRIPTION OF THE PREFERRED EMBODIMENTS

The vinyl monomers (A), (B), (C) and (D) are now described in detail.

((A) Silyl group-containing vinyl monomer)

The silyl group-containing monomer of general formula (I) is not particularly restricted but includes the following specific compounds, among others.

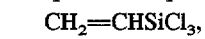

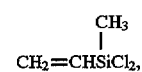

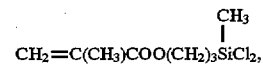

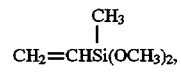

$CH_2=CHSi(OC_2H_5)_3$, $CH_2=CHSi(OC_2H_5)_2$ with $CH_3$ substituent, $CH_2=CHSi(OC_3H_7)_3$,
$CH_2=CHSi(OisoC_3H_7)_3$,
$CH_2=CHSi(OC_4H_9)_3$,
$CH_2=CHSi(OisoC_4H_9)_3$,
$CH_2=CHSi(OsecC_4H_9)_3$,
$CH_2=CHSi(OC_6H_{13})_3$,
$CH_2=CHSi(OC_8H_{17})_3$,
$CH_2=CHSi(OC_{10}H_{21})_3$,
$CH_2=CHSi(OC_{12}H_{25})_3$,
$CH_2=CHCOO(CH_2)_3Si(OCH_3)_3$, $CH_2=CHCOO(CH_2)_3Si(OCH_3)_2$ with $CH_3$ substituent, $CH_2=C(CH_3)COO(CH_2)_3Si(OCH_3)_3$, $CH_2=C(CH_3)COO(CH_2)_3Si(OCH_3)_2$ with $CH_3$ substituent, $CH_2=CH-CH_2OCO(ort-C_6H_4)COO(CH_2)_3-Si(OCH_3)_3$, $CH_2=CH-CH_2OCO(ort-C_6H_4)COO(CH_2)_3-Si(OCH_3)_2$ with $CH_3$ substituent, $CH_2=C(CH_3)COO(CH_2)_3Si(OC_2H_5)_3$, $CH_2=C(CH_3)COO(CH_2)_3Si(OC_2H_5)_2$ with $CH_3$ substituent, $CH_2=CH(CH_2)_4Si(OCH_3)_3$,
$CH_2=CH(CH_2)_8Si(OCH_3)_3$,
$CH_2=CH-O(CH_2)_3Si(OCH_3)_3$,
$CH_2=CH-OCO(CH_2)_{10}Si(OCH_3)_3$,
$CH_2=CH-(p-C_6H_4)Si(OCH_3)_3$, $CH_2=C(CH_3)COO(CH_2)_2O(CH_2)_3Si(OCH_3)_2$ with $CH_3$ substituent, $CH_2=C(CH_3)COO(CH_2)_{11}Si(OCH_3)_3$.

These silyl group-containing vinyl monomers can be used alone or in combination. Particularly from the standpoints of the ease of handling, prices and reaction byproducts, alkoxysilyl group-containing vinyl monomers are preferred.

The silyl group-containing vinyl monomer (A) is copolymerized at the rate of 1–30% (weight %; the same applies hereinafter) for the core and 0–30% for the outer shell. If the proportion of (A) is less than 1% for the core, the water resistance and durability may not be sufficient. If it is over 30% for the core or for the outer shell, the emulsion will be unstable.

((B) Alkyl methacrylate whose alkyl moiety has not less than 4 carbon atoms and cycloalkyl methacrylate whose cycloalkyl moiety has not less than 4 carbon atoms)

There is no particular restriction in regard to the kinds of C≧4 alkyl or cycloalkyl methacrylate that can be used but there can be mentioned n-butyl methacrylate, iso-butyl methacrylate, tert-butyl methacrylate, 2-ethylhexyl methacrylate, isodecyl methacrylate, lauryl methacrylate, tridecyl methacrylate, stearyl methacrylate, cyclohexyl methacrylate and isobornyl methacrylate, among others. Among them, n-butyl methacrylate and cyclohexyl methacrylate are particularly advantageous in terms of price, weather resistance of composition, balance between hardness and impact resistance, and ease of control of the glass transition temperature (Tg) of the resin emulsion.

This component (B) is copolymerized at the rate of 60–99% for the core and 60–99.5% for the outer shell in the multi-stage polymerization process. If the proportion of (B) is less than 60%, the stability of silyl groups will be sacrificed and the lowest film-forming temperature is elevated.

((C) other non-hydrophilic vinyl monomer)

There is no restriction in regard to (C) non-hydrophilic vinyl monomer other than (B) but there can be mentioned (meth)acrylate monomers such as methyl (meth)acrylate, ethyl (meth)acrylate, n-butyl acrylate, iso-butyl acrylate, tert-butyl acrylate, benzyl (meth)acrylate, cyclohexyl acrylate, etc., fluorine-containing vinyl monomers such as trifluoroethyl (meth)acrylate, pentafluoropropyl (meth) acrylate, perfluorocyclohexyl (meth)acrylate, 2,2,3,3-tetrafluoropropyl methacrylate, β-(perfluorooctyl)ethyl (meth)acrylate, etc., aromatic vinyl monomers such as styrene, α-methylstyrene, chlorostyrene, 4-hydroxystyrene, vinyltoluene, etc., vinyl esters and allyl compounds such as vinyl acetate, vinyl propionate, diallyl phthalate, etc., nitrile group-containing vinyl monomers such as (meth) acrylonitrile etc., epoxy group-containing vinyl monomers such as glycidyl (meth)acrylate etc., hydroxyl group-containing vinyl monomers such as 2-hydroxyethyl (meth) acrylate, 2-hydroxypropyl (meth)acrylate, 2-hydroxyethyl vinyl ether, hydroxystyrene, Aronix 5700 (manufactured by Toagosei Chemical Industry Co., Ltd.), Placcel FA-1, Placcel FA-4, Placcel FM-1 and Placcel FM-4 (all manufactured by Daicel Chemical Industries, Ltd.), HE-10, HE-20, HP-10 and HP-20 (all manufactured by Nippon Shokubai Co., Ltd.), Blemmer PEP series, Blemmer NKH-5050 and Blemmer GLM (all manufactured by Nippon Oil and Fats Co., Ltd.) and modified hydroxyalkylvinyl monomers, etc.; vinyl-containing condensation products of hydroxyalkyl esters of α,β-ethylenically unsaturated carboxylic acids, such as hydroxyalkyl esters of (meth)acrylic acid, with phosphoric acid or its ester and urethane or siloxane bond-containing (meth)acrylates; AS-6, AN-6, AA-6, AB-6, AK-5, etc. which are macromonomers available from Toagosei Chemical Industry Co., Ltd., other vinyl monomers such as vinyl methyl ether, vinyl chloride, vinylidene chloride, chloroprene, propylene, butadiene, etc., polymeric light stabilizers and polymeric ultraviolet absorbers such as LA87, LA82, LA22, etc. which are available from Asahi Denka Kogyo Co., Ltd. [In the above list of examples, the term (meth)acrylate means either acrylate or methacrylate, the term (meth)acrylonitrile means acrylonitrile or methacrylonitrile, and the term (meth)acrylic acid means acrylic acid or methacrylic acid].

The use of a fluorine-containing vinyl monomer or a siloxane-containing vinyl monomer contributes to the enhancement of water repellency, resistance to water and durability.

The use, in addition, of a monomer containing two or more polymerizable unsaturated bonds, such as polyethylene glycol dimethacrylate, ethylene glycol diacrylate, triallyl cyanurate, etc., results in the formation of a crosslinked polymer.

The component (C) is copolymerized at the rate of 0–39% for the core and 0–39.5% for the outer shell.

((D) hydrophilic vinyl monomer)

It is essential that the outer shell of emulsion particles contains a hydrophilic vinyl monomer (D) unit selected from the class consisting of α,β-ethylenically unsaturated carboxylic acids, styrenesulfonic acid, vinylsulfonic acid, sodium styrenesulfonate, 2-sulfoethyl methacrylate sodium, 2-sulfoethyl methacrylate ammonium, acrylamide, methacrylamide, N-methylolacrylamide, N-methylolmethacrylamide, dialkylaminoalkyl methacrylates, dialkylaminoalkyl methacrylate hydrochlorides, 2-aminoethyl methacrylate hydrochloride, polyethoxylated (polyoxyethylene chain-containing) vinyl monomers and polypropoxylated (polyoxypropylene chain-containing) vinyl monomers.

Among said α,β-ethylenically unsaturated carboxylic acids are acrylic acid, methacrylic acid, maleic acid, itaconic acid, crotonic acid, fumaric acid and citraconic acid, to name but a few examples.

Among said dialkylaminoalkyl methacrylates and dialkylaminoalkyl methacrylate hydrochlorides are dimethylaminoethyl methacrylate, diethylaminoethyl methacrylate, dimethylaminopropyl methacrylate, etc., inclusive of their hydrochlorides.

There is no particular restriction in regard to the polyethoxylated vinyl monomers but polyethoxylated acrylic or methacrylic esters are preferred. Thus, for example, Blemmer PE-90, PE-200, PE-350, PME-100, PME-200, PME-400 and AE-350 (all manufactured by Nippon Oil and Fats Co., Ltd.), MA-30, MA-50, MA-100, MA-150, RA-1120, RA-2614, RMA-564, RMA-568, RMA-1114 and MPG130-MA (all manufactured by Nippon Nyukazai Co., Ltd..) can be mentioned.

There is no particular restriction in regard to the polypropoxylated vinyl monomers but Blemmer PP-1000, PP-500, PP-800 and kP-400 (all manufactured by Nippon Oil and Fats Co., Ltd.) and RS-30 (Sanyo Chemical Industries, Ltd.) can be mentioned by way of example.

Particularly, as component (D), the use of a polyethoxylated vinyl monomer results in a marked improvement in the stability of silyl groups, a reduced aging of film-forming performance, and satisfactory mechanical stability and white enamel gloss of the emulsion. The number of ethylene oxide units in the polyoxyethylene chain is preferably 2–30. If it is less than 2, the emulsion will be not satisfactory in mechanical stability and white enamel gloss, while as it exceeds 30, the coating film tends to become too soft and ready to pick up dirt.

The component (D) is copolymerized at the rate of 0.5–30%. If its proportion is less than 0.5%, the mechanical stability and white enamel gloss, for instance, tends to be sacrificed. If it exceeds 30%, the water resistance will be poor.

The process for production of the emulsion is now described.

As a first stage of polymerization, a mixture of (A), (B) and (C) is first emulsion-polymerized by the known emulsion polymerization method and, then, a second and subsequent stages of polymerization are serially carried out in the presence of the resultant polymer (called the core polymer). As far as the components (A), (B) and (C) are concerned, the emulsion polymerization in the second and subsequent stages may be carried out using the same monomer composition as the first-stage monomer composition or a different monomer composition. The polymer obtained from the monomer composition in the final stage is called the outer shell. In this invention, it is essential that component (D) occurs in a proportion of 0.5–30% based on the total monomer composition of the outer shell.

The multi-stage polymerization of this invention is conducted in 2–4 stages and is preferably conducted in such a manner that the weight ratio of the core to the remainder of emulsion particles will be 10:90 to 90:10. The structure of the polymer obtained by this process is referred to as the multilamellar structure.

When a polyethoxylated anionic surfactant is used as the surfactant in the polymerization system, the silyl groups are stabilized. The polyethoxylated anionic surfactant mentioned above includes polyoxyethylenenonylphenyl ether sulfate such as Newcol-560SN and Newcol-560SF (both by Nippon Nyukazai Co., Ltd.), Emal NC-35 and Level WZ (both by manufactured by Kao Corporation), polyoxyethylene-allyl ether sulfate such as Newcol-707SF, Newcol-707SN, Newcol-723SF and Newcol-740SF, octylphenoxyethoxyethylsulfonate such as Newcol-861SE, and polyoxyethylene-tridecyl ether sulfate such as Newcol-1305SN (all manufactured by Nippon Nyukazai Co., Ltd.), among others.

The number of ethylene oxide units in the polyoxyethylene chain is preferably 1–50 from the standpoint of the stability of polymerization reaction and of hydrolyzable silyl groups. Moreover, from the standpoint of the water resistance of the coating film, anionic surfactants of the ammonium salt type are preferred.

The polyethoxylated anionic surfactant can be used in combination with other ionic or nonionic surfactants.

As the other ionic surfactant, there is no particular restriction but salts of sulfonic acids such as sodium laurylsulfonate, sodium dodecylbenzenesulfonate, sodium isooctylbenzenesulfonate, etc. can be mentioned.

The nonionic surfactants that can be so employed include, as typical examples, polyoxyethylene compounds such as polyoxyethylene nonyl phenyl ether, polyoxyethylene lauryl ether, etc. and silicon-containing nonionic surfactants such as L-77, L-720, L-5410, L-7602 and L-7607 (all manufactured by Union Carbide Co. ).

In the practice of this invention, a reactive surfactant containing a polymerizable double bond within the molecule can also be employed as the surfactant. The use of a reactive surfactant containing a polyoxyethylene group within the molecule, in particular, results in improved water resistance. The reactive surfactant mentioned above includes Adekasoap NE-10, NE-20, NE-30, NE-40 and SE-10N (all manufactured by Asahi Denka Kogyo K.K.), Antox-MS-60 (Nippon Nyukazai Co., Ltd.), Aqualon RN-20, RN-30, RN-50, HS-10, HS-20 and HS-1025 (all manufactured by Daiichi Kogyo Seiyaku Co., Ltd.), among others.

The proportion of the polyethoxylated anionic surfactant based on the total monomer is 0.01–20% and preferably 0.05–10%. If the proportion is less than 0.01%, the polymerization reaction will be unstable. If it exceeds 20%, the water resistance will be unsatisfactory.

A water-soluble resin can also be used additionally in the polymerization reaction. This practice results in enhanced water resistance. The water resistance can be further improved by introducing silyl groups of general formula (I) into the water-soluble resin.

To insure a more stable progress of polymerization, the reaction is carried out in the presence of a redox catalyst at a temperature not exceeding 70° C., preferably at a temperature from 40° to 65° C. For stabilizing the silyl groups, the pH of the polymerization system is controlled preferably to pH 5–8 and, for still better results, to pH 6–7.

The redox catalyst mentioned above includes such combinations as potassium persulfate or ammonium persulfate with acid sodium sulfite or Rongalit, hydrogen peroxide-ascorbic acid, and an organic peroxide such as t-butyl hydroperoxide, benzoyl peroxide, cumene hydroperoxide, p-menthane hydroperoxide or the like with acid sodium sulfite or Rongalit, to mention but a few examples. The combination of an organic peroxide with a reducing agent is particularly preferred for stable polymerization. Furthermore, in order to provide for stable catalyst activity, a ferrous ion-containing compound such as iron sulfate and a chelating agent such as disodium ethylenediaminetetraacetate can be concomitantly employed.

The amount of such a redox catalyst (initiator) relative to the total monomer is preferably 0.01–10% by weight and, for still better results, 0.05–5% by weight.

The nonvolatile (solids) content of the emulsion according to this invention is preferably 20–70% and, for still better results, 30–60%. If the solids content exceeds 70%, the viscosity of the system will be increased to make it difficult to remove the heat of polymerization reaction or cause the inconvenience that it takes time to withdraw the product from the polymerization reactor. If the solids content is less than 20%, the polymerization procedure will not be interfered with but the yield of the product resin per bach will be too small for economic production. Moreover, when the solids content is less than 20%, the coating film will be so thin that the degradation of film performance is inevitable and the coating operation is rendered difficult.

The emulsion consists of ultrafine particles with a mean particle size of about 0.02–0.7 μm and, therefore, exhibits an excellent film-forming property.

In applying the composition of this invention to a substrate, the addition of a curing agent assists in the crosslinking reaction. The curing agent includes organic metal compounds, acid catalysts and basic catalysts. Particularly preferred, from the standpoint of curing activity, are organoaluminum compounds and organotin compounds. Thus, for example, dibutyltin dilaurate, dibutyltin dimaleate, dioctyltin dilaurate, dioctyltin dimaleate, dibutyltin diacetate, dibutyltin dimethoxide, tributyltin sulfite, dibutyltin thioglycolate, tin octylate, etc. and aluminum isopropylate, aluminum tris(ethylacetoacetate), aluminum tris(acetylacetonate), ethylacetoacetatoaluminum diisopropylate, etc. can be mentioned.

These organometal compounds can be emulsified with, inter alia, an alkyl ether type surfactant and added to the system, in which case their curing activity and storage life can be improved. The amount of such an emulsion, in terms of the organometal compound, is preferably 0.01–10 parts (parts by weight; the same applies hereinafter) and, for still better results, 0.1–5 parts per 100 parts of the solids content of the silyl group-containing emulsion. If the proportion is less than 0.01 part, the curing activity is low. If it exceeds 10 parts, the water resistance will be decreased.

If required, the resultant curable composition may be supplemented with various additives which are used in ordinary coating compositions, e.g. pigments (white pigments such as titanium dioxide, calcium carbonate, barium carbonate, kaolin, etc., and colored pigments such as carbon, red iron oxide and organic pigments such as cyanine blue), film-forming agents, colloidal silica, plasticizers, solvents, dispersants, thickeners or thixotropic agents, antifoams, preservatives, ultraviolet absorbers and so on.

It is also possible to provide for fast-curing by adding a melamine resin, an isocyanate compound or the like as a curing agent.

The composition of this invention can be used as coating or finishing materials for exterior and interior sidings, automotive uses such as repair coating or top clear coating for metallic coats, direct coating for aluminum, stainless steel and other metal substrates, direct coating for slates, concrete structures, shingles, mortar and gypsum boards, asbestos slates, asbestos boards, precast concrete, lightweight aerated concrete, calcium silicate boards, tiles, bricks and other ceramics inclusive of glass, masonry, and other coating applications. The composition can also be used as bonding agents, adhesives and tackifiers.

Moreover, the composition can be blended with a commercial aqueous coating materials, e.g. thermosetting acrylic coatings such as acrylic and acrylicmelamine resin coatings or alkyd, epoxy or fluororesin coatings, for improving the weather resistance, acid resistance and solvent resistance of such coatings.

The room temperature curing composition of this invention features a high stability of silyl groups it contains and a remarkably improved film-forming property even after prolonged storage. Moreover, it is very satisfactory in mechanical stability, water resistance, durability and white enamel gloss.

The following examples are intended to illustrate this invention in detail and should by no means be construed as defining the scope of the invention.

EXAMPLES 1–8 AND COMPARATIVE EXAMPLES 1–4

A reactor equipped with a stirrer, reflux condensor, nitrogen gas inlet pipe and drip funnel was initially charged with 120 parts of deionized water, 0.7 part of Rongalit, 3 parts of Newcol-707SF, 0.6 part of ammonium acetate, 0.7 part of t-butyl hydroperoxide and the monomer mixture indicated in Table 1. Then, with nitrogen gas being introduced, the temperature was increased to 50° C. to carry out a polymerization for 1 hour. Then, in the cases of Examples 1–6 and Comparative Examples 1–4, 0.3 part of t-butyl hydroperoxide and the monomer emulsion indicated in Table 2 were added dropwise over a period of 3 hours.

In Examples 7 and 8, which represent three-stage polymerization processes, the core monomer composition was polymerized for 1 hour, then the intermediate-layer monomer emulsion indicated in Table 2 and 0.2 part of t-butyl hydroperoxide were added dropwise over a period of 2 hours, and finally the outer shell monomer emulsion and 0.1 part of t-butyl hydroperoxide were added dropwise over a period of 1 hour.

The polymerization reaction was further continued for 1 hour, after which the reaction system was adjusted to pH 7 with aqueous ammonia and a solids concentration of 40% with deionized water to provide an emulsion.

This emulsion was evaluated by the following procedures. The results are shown in Table 3.

(Evaluation Procedures)

(1) Stability of methoxysilyl groups (hydrolyzable silyl groups)

The synthesized emulsion was coated on a polyethylene sheet and allowed to stand at room temperature for 1 day.

The film formed on the polyethylene sheet was peeled off and subjected to infrared spectrometric analysis, and the residual rate (%) of methoxysilyl groups with respect to the charging amount of the methoxysilyl group-containing vinyl monomer was calculated.

(2) Long-term storage stability (appearance)

The emulsion was stored at 50° C. for 1 month and then, visually examined for its condition (appearance).

(3) Long-term storage stability (5° C. film-forming property)

To 100 parts, on a solids basis, of the emulsion stored at 50° C. for 1 month was added 10 parts of CS12 (a film-forming auxiliary agent manufactured by Chisso Corporation) and the mixture was allowed to stand at 5° C. overnight and coated on a glass plate. The coated glass plate was left standing at 5° C. overnight and observed for surface condition.

o represents no abnormality and x represents cracking or scaling.

(4) Mechanical Stability

The test according to JIS K6392 was carried out using a Marlon tester at a load of 15 kg for 5 minutes. After loading, the aggregate formed was weighed and its proportion (ppm) relative to the solids content of the emulsion charge was calculated.

(5) White Enamel Gloss

According to the formula shown below, the ingredients were dispersed using a sand mill at 1000 rpm for 1 hour to prepare a pigment paste. To 30 parts of this pigment paste were added 60 parts of the emulsion, 2.4 parts of CS12, 3 parts of propylene glycol, 0.02 part of SN defoamer 381, 4 parts of 20% UH420 (a thickener manufactured by Asahi Denka Kogyo Co., Ltd.) and 2.0 parts of 2% Thilose H4000P and the mixture was stirred well and coated on a glass plate. The coated plate was allowed to stand at room temperature for 1 day and the 60° gloss was measured with a glossmeter.

| | |
|---|---|
| Water | 20 parts |
| 14% aqueous ammonia | 0.3 part |
| Poiz 521 (a pigment wetting agent manufactured by Kao Corporation) | 1 part |
| SN defoamer 381 (a defoaming agent manufactured by San Nopco Co., Ltd.) | 0.3 part |
| 2% Thilose H 4000 P (a thickening agent manufactured by Hoechst Japan) | 6.5 parts |
| Titanium dioxide (a pigment) | 72 parts |

(6) Water Resistance

To 10 g of the emulsion were added 0.4 g of CS12 and 0.04 g, on a solids basis, of dibutyltin dilaurate emulsified according to the following formula and the mixture was coated on a polyethylene sheet. The coating was then dried at room temperature for 10 days. The coated sheet was then immersed in water at room temperature and the percent increase in weight relative to the weight of the film before immersion was determined.

| | |
|---|---|
| Dibutyltin dilaurate | 10 parts |
| TD-10014 (a surfactant manufactured by Nippon Nyukazai Co., Ltd.) | 4 parts |
| TD-1006 (a surfactant manufactured by Nippon Nyukazai Co., Ltd.) | 6 parts |
| Propylene glycol | 10 parts |
| Deionized water | 70 parts |

TABLE 1

| | Example | | | | | | | | Comparative Example | | | |
|---|---|---|---|---|---|---|---|---|---|---|---|---|
| | 1 | 2 | 3 | 4 | 5 | 6 | 7 | 8 | 1 | 2 | 3 | 4 |
| Core monomer composition (parts) | | | | | | | | | | | | |
| Butyl methacrylate | 70 | 60 | 60 | 70 | 70 | 95 | 70 | 70 | 70 | 60 | — | 70 |
| Methyl methacrylate | 10 | — | — | 10 | 5 | — | 10 | 10 | 15 | — | 80 | 10 |
| Butyl acrylate | 15 | 15 | 15 | 15 | 5 | — | 15 | 15 | 15 | 13 | 15 | 15 |
| Cyclohexyl methacrylate | — | 20 | — | — | — | — | — | — | — | 20 | — | — |
| γ-Methacryloxypropyl-trimethoxy-silane | 5 | — | 5 | 5 | 20 | 5 | 5 | 5 | — | — | 5 | 5 |
| Vinyl trimethoxy-silane | — | 5 | — | — | — | — | — | — | — | 5 | — | — |
| Acrylic acid | — | — | — | — | — | — | — | — | — | 2 | — | — |
| Styrene | — | — | 20 | — | — | — | — | — | — | — | — | — |

TABLE 2

| | Example | | | | | | | | | | Comparative Example | | | |
|---|---|---|---|---|---|---|---|---|---|---|---|---|---|---|
| | | | | | | | 7 | | 8 | | | | | |
| | 1 | 2 | 3 | 4 | 5 | 6 | IM | OS | IM | OS | 1 | 2 | 3 | 4 |
| Intermediate and outer shell monomer emulsion composition*[1] (parts) | | | | | | | | | | | | | | |
| Butyl methacrylate | 70 | 60 | 70 | 70 | 70 | 91 | 25 | 25 | 25 | 25 | 70 | 60 | — | 70 |
| Methyl methacrylate | 10 | — | — | 10 | 10 | — | 6 | 4 | 6 | 4 | 14 | — | 80 | 14 |
| Butyl acrylate | 11 | 11 | 11 | 11 | 8 | — | 7 | 4 | 7 | 4 | 12 | 13 | 11 | 11 |
| Cyclohexylmethacrylate | — | 20 | — | — | — | — | — | — | — | — | — | 20 | — | — |
| γ-Methacryloxypropyltrimethoxysilane | 5 | — | 5 | 5 | 8 | 5 | 3 | 2 | 5 | — | — | — | 5 | 5 |
| Vinyltrimethoxysilane | — | 5 | — | — | — | — | — | — | — | — | — | 5 | — | — |

TABLE 2-continued

|  | Example | | | | | | | | | | Comparative Example | | | |
|---|---|---|---|---|---|---|---|---|---|---|---|---|---|---|
|  |  |  |  |  |  |  | 7 | | 8 | | | | | |
|  | 1 | 2 | 3 | 4 | 5 | 6 | IM | OS | IM | OS | 1 | 2 | 3 | 4 |
| Acrylic acid | — | 4 | — | — | — | — | — | — | — | — | — | 2 | — | — |
| MA-100*² | 4 | — | 6 | 4 | 4 | 4 | — | 4 | — | 4 | 4 | — | 4 | — |
| Styrene | — | — | 8 | — | — | — | 20 | — | 20 | — | — | — | — | — |
| Deionized water | 60 | 60 | 60 | 60 | 60 | 60 | 36 | 24 | 36 | 24 | 60 | 60 | 60 | 60 |
| Newcol-707SF*³ | 1.6 | 1.6 | 1.6 | — | 1.6 | 1.6 | 1.0 | 0.6 | 1.0 | 0.6 | 1.6 | 1.6 | 1.6 | 1.6 |
| Sodium dodecylbenzenesulfonate | — | — | — | 1.6 | — | — | — | — | — | — | — | — | — | — |

*¹ The outer shell monomer emulsions for Examples 1–6 and Comparative Examples 1–4
*² A polyethoxylated methacrylate ester (Nippon Nyukazai Co., Ltd.)
*³ A polyethoxylated anionic surfactant (Nippon Nyukazai Co., Ltd.)
IM: Intermediate
OS: Outer shell

TABLE 3

|  | Example | | | | | | | | Comparative Example | | | |
|---|---|---|---|---|---|---|---|---|---|---|---|---|
|  | 1 | 2 | 3 | 4 | 5 | 6 | 7 | 8 | 1 | 2 | 3 | 4 |
| Evaluation | | | | | | | | | | | | |
| Polymerization result | Good | Good | Good | Good | Good | Good | Good | Good | Good | Gelation in core polymerization | Good | Scaling |
| Methoxysilyl residue (%) | 90 | 75 | 85 | 70 | 85 | 93 | 85 | 90 | — | — | 10 | 70 |
| Long-term storage stability | | | | | | | | | | | | |
| ○Appearance | No change | No change | No change | No change | No change | No change | No change | No change | No change | — | No change | No change |
| ○5° C. film-forming properly | ○ | ○ | ○ | ○ | ○ | ○ | ○ | ○ | ○ | — | x | ○ |
| Mechanical stability (ppm) | 10 | 40 | 15 | 20 | 5 | 10 | 5 | 5 | 200 | — | 90 | 30000 |
| White enamel gloss | 75 | 70 | 80 | 75 | 75 | 80 | 80 | 80 | 30 | — | 15 | 20 |
| Water resistance | 5 | 7 | 5 | 6 | 3 | 3 | 5 | 9 | 70 | — | —*⁴ | 10 |

*⁴ Undeterminable because of no film formation

What is claimed is:

1. A room temperature curing composition comprising an emulsion obtained by a multi-stage polymerization of a plurality of monomers, said emulsion comprising emulsion particles, the core of which is formed by polymerization of 1–30 weight % of (A) a silyl group-containing vinyl monomer of the following general formula (I), 60–99 weight % of (B) at least one member selected from the class consisting of alkyl methacrylates whose alkyl moieties contain not fewer than 4 carbon atoms each and cycloalkyl methacrylates whose cycloalkyl moieties contain not fewer than 4 carbon atoms each, and 0–39 weight % of (C) a non-hydrophilic vinyl monomer other than (B) and the outer shell of which is formed by polymerization of 0.5–30 weight % of (D) at least one hydrophilic vinyl monomer selected from the class consisting of α,β-ethylenically unsaturated carboxylic acids, styrenesulfonic acid, vinylsulfonic acid, sodium styrenesulfonate, 2-sulfoethyl methacrylate sodium, 2-sulfoethyl methacrylate ammonium, acrylamide, methacrylamide, N-methylolacrylamide, N-methylolmethacrylamide, dialkylaminoalkyl methacrylates, dialkylaminoalkyl methacrylate hydrochlorides, 2-aminoethyl methacrylate hydrochloride, polyethoxylated vinyl monomers and polypropoxylated vinyl monomers, 0–30 weight % of (A) a silyl group-containing vinyl monomer of the following general formula (I), 60–99.5 weight % of (B) at least one member selected from the class consisting of alkyl methacrylates whose alkyl moieties contain not fewer than 4 carbon atoms each and cycloalkyl methacrylates whose cycloalkyl moieties contain not fewer than 4 carbon atoms each, and 0–39.5 weight % of (C) a non-hydrophilic vinyl monomer other than (B):

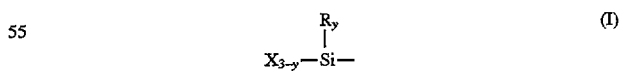

$$X_{3-y}-\underset{\underset{\displaystyle |}{}}{\overset{\overset{\displaystyle R_y}{|}}{Si}}-$$

wherein R represents a monovalent hydrocarbon group selected from $C_{1-10}$ alkyl, aryl and aralkyl groups; X represents a halogen atom or a group selected from the class consisting of alkoxy, hydroxy, acyloxy, aminooxy, phenoxy, thioalkoxy and amino; y represents a whole number of 0–2; where X and R, bound to Si, respectively represent more than one group, such groups may be the same or different groups.

2. The room temperature curing composition of claim 1 wherein said emulsion is an emulsion obtained by emulsion-polymerization using a polyethoxylated anionic surfactant.

3. The room temperature curing composition of claim 1 wherein said silyl group-containing vinyl monomer (A) is an alkoxysilyl group-containing vinyl monomer.

4. The room temperature curing composition of claim 1 wherein said hydrophilic vinyl monomer (D) is a polyethoxylated vinyl monomer.

5. The room temperature curing composition of claim 1 further containing a curing agent.

6. The room temperature curing composition of claim 5 wherein said curing agent is an organoaluminum or organotin compound emulsified by using an alkyl ether type surfactant at least as a main emulsifier.

7. The room temperature curing composition of claim 4 wherein said polyethoxylated vinyl monomer is a polyethoxylated acrylic or methacrylic ester.

8. The room temperature curing composition of claim 4 wherein said polyethoxylated vinyl monomer has a polyoxyethylene chain wherein the number of ethylene oxide units is 2–30.

* * * * *